United States Patent
Wu

(10) Patent No.: US 6,762,538 B2
(45) Date of Patent: Jul. 13, 2004

(54) ELECTROLUMINESCENCE ELEMENT WITH MIXTURE OF ELECTROLUMINESCENCE MATERIAL AND ORIENTATING MATERIAL

(75) Inventor: Long Hai Wu, Taoyuan Shien (TW)

(73) Assignee: Hannstar Display Corp., Taipei (JP)

( * ) Notice: Subject to any disclaimer, the term of this patent is extended or adjusted under 35 U.S.C. 154(b) by 200 days.

(21) Appl. No.: 09/817,912

(22) Filed: Mar. 26, 2001

(65) Prior Publication Data

US 2002/0063502 A1 May 30, 2002

(30) Foreign Application Priority Data

Nov. 28, 2000 (TW) ........................................ 89125257 A

(51) Int. Cl.[7] ............................ H01J 5/16; H01J 61/40; G02F 1/1337; G02F 1/13; G02F 1/10
(52) U.S. Cl. ...................... 313/112; 349/123; 349/135; 349/137; 349/69; 349/194; 427/163.1; 359/492
(58) Field of Search .......................... 349/69, 123, 125, 349/127, 194; 313/112; 427/163.1; 359/492

(56) References Cited

U.S. PATENT DOCUMENTS

| 5,748,271 | A | * | 5/1998 | Hikmet et al. ................. 349/69 |
| 5,936,691 | A | * | 8/1999 | Kumar et al. ................ 349/124 |
| 6,262,788 | B1 | * | 7/2001 | Hanrahan et al. ........... 349/117 |
| 6,491,847 | B1 | * | 12/2002 | Takiguchi et al. ...... 252/299.62 |

* cited by examiner

Primary Examiner—Ashok Patel
Assistant Examiner—Matt Hodges
(74) Attorney, Agent, or Firm—Knoble Yoshida & Dunleavy, LLC

(57) ABSTRACT

A polarized electroluminescence element used for a display is disclosed. The polarized electroluminescence element includes a substrate, an orientation-inducing layer situated on the substrate and in a first direction of orientation, and a light-emitting layer situated on the orientation-inducing layer and made of a mixture of an electroluminescent material and an oriented material for emitting polarized electroluminescence, wherein the electroluminescent material and the oriented material are in a second direction of orientation corresponding to the first direction of orientation.

20 Claims, 3 Drawing Sheets

ELECTROLUMINESCENCE ELEMENT WITH MIXTURE OF ELECTROLUMINESCENCE MATERIAL AND ORIENTATING MATERIAL

FIELD OF THE INVENTION

The present invention relates to a polarized electroluminescence element and a method for fabricating the polarized electroluminescence element, and more particularly to a polarized electroluminescence element used in a backlight source of a display.

BACKGROUND OF THE INVENTION

An electroluminescence element emits light when a high electric field is applied thereon, and can be used for a product having a light-emitting flat panel display.

For certain applications particularly in the field of display elements, emission of polarized light is particularly important. The backlight source of conventional liquid crystal displays, e.g. video display units for computers, has to be polarized. Generally, the light-emitting material of the electroluminescence element should be in regular alignment to emit polarized electroluminescence.

A well-known polymer, for example poly(p-phenylene vinylene) (PPV) has already been used in electroluminescence elements. PPV is arranged ordinarily in a direction of orientation by rubbing unidirectionally. However, the alignment of the PPV material is not fully unidirectional. Therefore, the emission efficiency of the electroluminescence element composed of PPV is not high. In addition, there are some drawbacks of the unidirectional rub. One is that the surface of the film is easily destroyed, and the other is that the pollution of the crusher may be formed.

For improving the emission efficiency of the electroluminescence, an electron-hole transporting layer may be added to the light-emitting layer. A known electron-hole transporting layer is made of $AlQ_3$ which is a complex of aluminum with 8-hydroxy quinoline. In addition, the electron-hole transporting layer can also be made of discotic liquid crystal molecules. However, the mission efficiency of the electroluminescence is not improved because the electron-hole transporting layer is not in regular alignment.

Hence, for improving the emission efficiency, the present invention discloses an electroluminescence element and a method for fabricating the electroluminescence element so as to overcome the problems described above.

SUMMARY OF THE INVENTION

It is therefore an object of the present invention to provide a polarized electroluminescence element for a display.

In accordance with the present invention the polarized electroluminescence element includes a substrate, an orientation-inducing layer situated on the substrate and in a first direction of orientation, and a light-emitting layer situated on the orientation-inducing layer and made of a mixture of an electroluminescent material and an oriented material for emitting polarized electroluminescence, wherein the electroluminescent material and the oriented material are in a second direction of orientation corresponding to the first direction of orientation.

Preferably, the substrate is a glass plate.

Preferably, the orientation-inducing layer is a conductive layer.

Preferably, the orientation-inducing layer is made of polyimide.

In accordance with the present invention, the second direction of orientation is parallel to the first direction of orientation of the orientation-inducing layer. In addition, the oriented material of the light-emitting layer is guided by the orientation-inducing layer to display in the second direction of orientation and performs electron-hole transport in a direction perpendicular to the light-emitting layer.

Preferably, the oriented material of the light-emitting layer is discotic liquid crystal molecules. The electroluminescent material of the light-emitting layer is guided by the oriented material to display in the second direction of orientation.

Preferably, the electroluminescent material of the light-emitting layer is one of polyimide and polyphenylamide.

Furthermore, the light-emitting layer has a structure of cross-linking polymer.

Certainly, the display could be an electroluminescence display.

Certainly, the display could be a liquid crystal display.

It is another object of the present invention to provide a polarized electroluminescence element used in a backlight source of a display In accordance with the present invention, the polarized electroluminescence element includes a substrate, and a light-emitting layer situated on the substrate and made of a mixture of an electroluminescent material and discotic liquid crystal molecules in a direction of orientation for emitting polarized electroluminescence and performing electron-hole transport in a direction perpendicular to the light-emitting layer.

It is another object of the present invention to provide a method for fabricating a polarized electroluminescence element.

In accordance with the present invention, the method includes steps of a) providing a substrate, b) forming an orientation-inducing layer on the substrate, c) performing an orientation-inducing process on the orientation-inducing layer to make the orientation-inducing layer align in a first direction of orientation, d) providing a mixture of an electroluminescent material and an oriented material, e) forming the mixture on the orientation-inducing layer to be a light-emitting layer, and f) inducing the oriented material of the light-emitting layer by the orientation-inducing layer to align in a second direction of orientation corresponding to the first direction of orientation and inducing the electroluminescent material of the light-emitting layer to align in the second direction of orientation.

In addition, the orientation-inducing layer formed on the substrate is performed by coating. Certainly, the orientation-inducing process could be performed by exposure to light, or the orientation-inducing process could be performed by rubbing.

Preferably, the mixture is formed on the orientation-inducing layer by coating.

Preferably, the orientation-inducing process is performed at the temperature ranged from 80° C. to 120° C.

In accordance with the present invention, each the electroluminescent material and the oriented material further includes photo-polymerization functional groups.

In accordance with the present invention, the method further includes a step of cross-linking the electroluminescent material and the oriented material by exposure to light.

In addition, the second direction of orientation is parallel to the first direction of orientation.

It is another object of the present invention to provide a method for improving emission efficacy of a light-emitting layer in a polarized electroluminescence element.

In accordance with the present invention, the method includes steps of a) forming a light-emitting layer by mixing an electroluminescent material and an electron-hole transporting material, and b) inducing the electron-hole transporting material by an orientation-inducing layer to align in a direction of orientation, and inducing the electroluminescent material to align in the direction of orientation.

Preferably, the electron-hole transporting material is discotic liquid crystal molecules.

The present invention may best be understood through the following descriptions with reference to the accompanying drawings, in which:

DETAILED DESCRIPTION OF THE PREFERRED EMBODIMENTS

A preferred embodiment of the present invention is described in detail with reference to the drawings.

FIGS. 1(a)–(d) are schematic views showing the method for fabricating the electroluminescence element according to the preferred embodiment of the present invention. A conductive orientation-inducing material is coated on a substrate 10 to form an orientation-inducing layer 11.

Figure 1A:
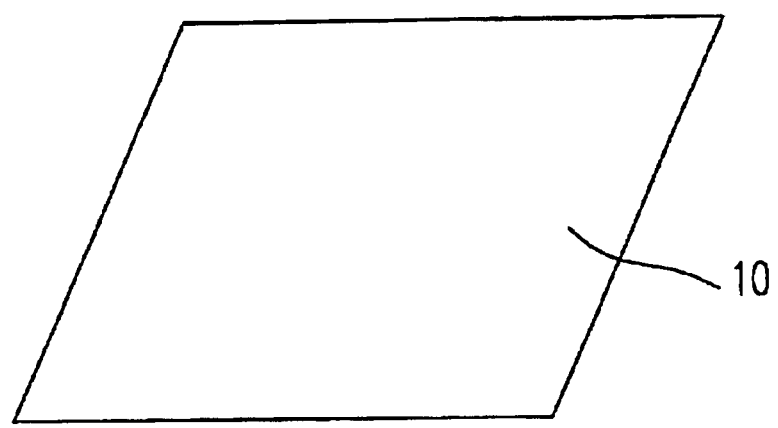
FIGS. 1(a)–(d) are schematic views showing the steps of preparing the electroluminescence element according to the method of the present invention.
Figure 1B:
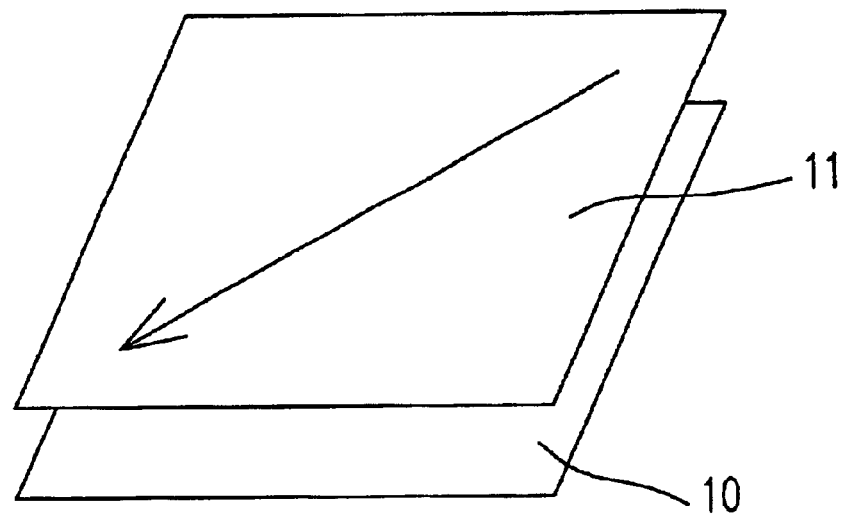
Figure 1C:
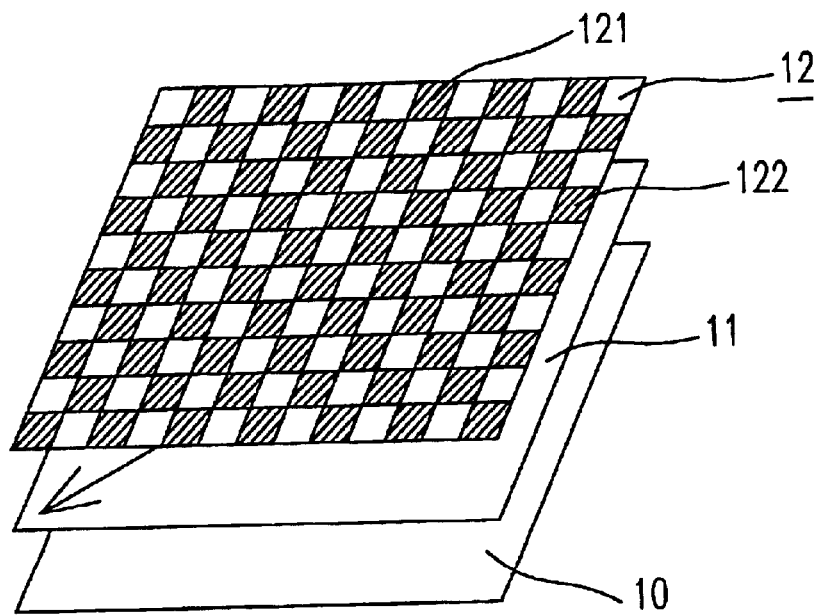
Figure 1D:
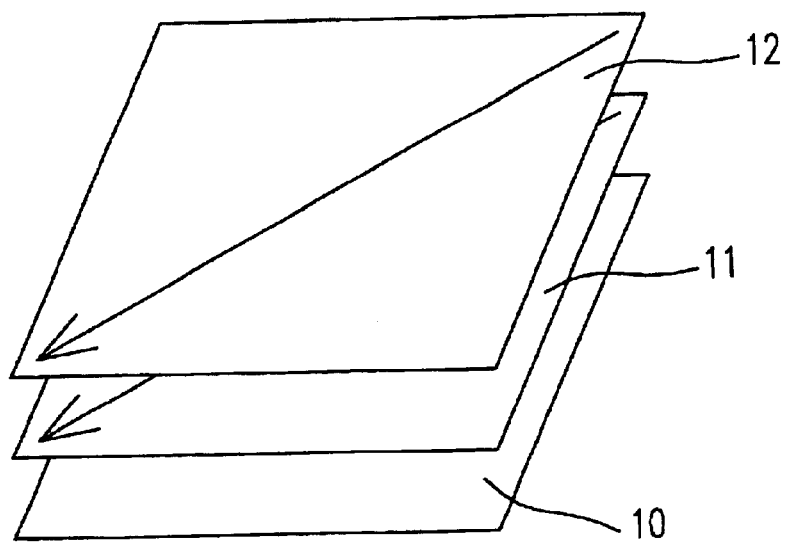

Subsequently, the orientation-inducing layer 11 in a direction of orientation is obtained by exposure to light or by rubbing unidirectionally as shown in FIG. 1(b). The arrow in FIG. 1(b) indicates the direction of the orientation, but not indicates a specific direction of orientation. For preparing the light-emitting material, the electroluminescent material 122 including photo-polymerization functional groups and the oriented material 121 including photo-polymerization functional groups are mixed to form a mixture. The mixture is coated on the orientation-inducing layer 11 to form a light-emitting layer 12 as shown in FIG. 1(c). The orientation of the oriented material 121 of the light-emitting layer 12 is induced by the orientation-inducing layer 11. In the meanwhile, the orientation of the electroluminescent material 122 of the light-emitting layer 12 is induced by the oriented material 121. Therefore, the orientation of the light-emitting layer 12 is aligned regularly as shown in FIG. 1(d). The arrow in FIG. 1(d) indicates that the orientation of the light-emitting layer 12 is parallel to the orientation of the orientation-inducing layer 11.

Figure 2:
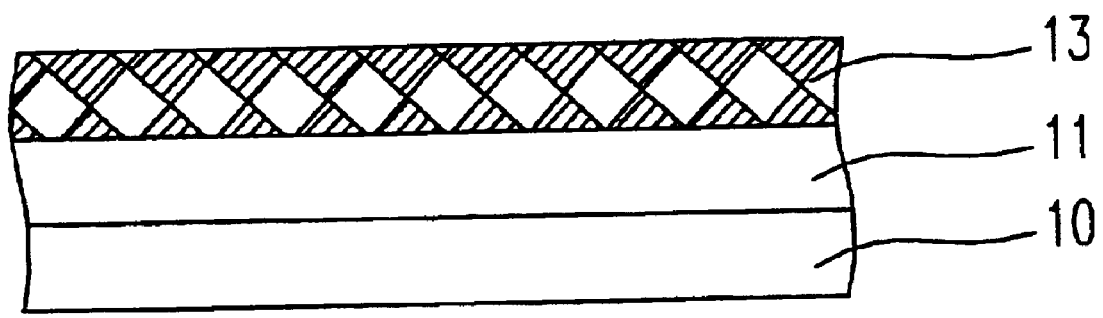
FIG. 2 is a sectional view showing the electroluminescence element of the present invention.

In a cross-linking condition, the photo-polymerization functional groups of the electroluminescent material 122 and the oriented material 121 are polymerized to form a light-emitting layer 13 providing a better mechanical property as shown in FIG. 2.

Certainly, the materials used in the present invention are depend on the application of the polarized electroluminescence element. For example, when the electroluminescence element is used in the backlight source of an electroluminescence display or a liquid crystal display, the substrate 10 is preferably made of glass, the material of the orientation-inducing layer 11 is polyimide, the electroluminescent material 122 is polyimide or polyaniline, and the oriented material 121 is discotic liquid crystal molecule. The advantage of using discotic liquid crystal molecules as the oriented material 121 is that the electron-hole transport of the discotic liquid crystal molecules is aligned regularly. Hence, the electron-hole transport in a direction perpendicular to the light-emitting layer 12 is performed. Therefore, the emission efficiency of the light-emitting layer 12 is improved.

In addition, the orientation of the oriented material 121 is induced by the orientation-inducing layer 11 at the temperature ranged from 80° C. to 120° C. The cross-linking of the photo-polymerization functional groups of the electroluminescent material 122 and the oriented material 121 are polymerized by exposure to UV light. Certainly, the orientation-inducing condition and the cross-linking condition of the present invention could be changed with the materials.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A polarized electroluminescence element for a display comprising:

a substrate;

an orientation-inducing layer situated on said substrate and in a first direction of orientation obtained by exposing to light; and a light-emitting layer situated on said orientation-inducing layer and made of a mixture of an electroluminescent material and an oriented material for emitting polarized electroluminescence, wherein said electroluminescent material and said oriented material are in a second direction of orientation corresponding to said first direction of orientation, and said electroluminescent material is selected from the group consisting of polyimide and polyphenylamide.

2. The polarized electroluminescence element according to claim 1, wherein said substrate is a glass plate.

3. The polarized electroluminescence element according to claim 1, wherein said orientation-inducing layer is a conductive layer.

4. The polarized electroluminescence element according to claim 3, wherein said orientation-inducing layer is made of polyimide.

5. The polarized electroluminescence element according to claim 1, wherein said second direction of orientation is parallel to said first direction of orientation of said orientation-inducing layer.

6. The polarized electroluminescence element according to claim 1, wherein said oriented material of said light-emitting layer is guided by said orientation-inducing layer to align in said second direction of orientation and perform electron-hole transport in a direction perpendicular to said light-emitting layer.

7. The polarized electroluminescence element according to claim 6 wherein said oriented material of said light-emitting layer is discotic liquid crystal molecules.

8. The polarized electroluminescence element according to claim 1, wherein said electroluminescent material of said light-emitting layer is guided by said oriented material to display in said second direction of orientation.

9. The polarized electroluminescence element according to claim 1, wherein said display is an electroluminescence display.

10. The polarized electroluminescence element according to claim 1, wherein said display is a liquid crystal display.

11. A polarized electroluminescence element for a display comprising:
    a substrate;
    an orientation-inducing layer situated on said substrate and in a first direction of orientation; and
    a light-emitting layer situated on said orientation-inducing layer and made of a mixture of an electroluminescent material and an oriented material for emitting polarized electroluminescence, wherein said electroluminescent material of said light-emitting layer is one of polyimide and polyphenylamide, said electroluminescent material and said oriented material are in a second direction of orientation corresponding to said first direction of orientation and said electroluminescent material of said light-emitting layer is guided by said oriented material to display in said second direction of orientation.

12. The polarized electroluminescence element for a display comprising:
    a substrate;
    an orientation-inducing layer situated on said substrate and in a first direction of orientation; and
    a light-emitting layer situated on said orientation-inducing layer and made of a mixture of an electroluminescent material and an oriented material for emitting polarized electroluminescence, wherein said electroluminescent material and said oriented material are in a said second direction of orientation corresponding to said first direction of orientation, and said light-emitting layer has a structure of cross-linking polymer.

13. A polarized electroluminescence element used in a backlight source of a display, comprising:
    a substrate; and
    a light-emitting layer situated on said substrate and made of a mixture of an electroluminescent material and discotic liquid crystal molecules in a direction of orientation for emitting polarized electroluminescence and performing electron-hole transport in a direction perpendicular to said light-emitting layer, wherein said direction of orientation is obtained by exposing to light and said electroluminescent material is selected from the group consisting of polyimide and polyphenylamide.

14. The polarized electroluminescence element according to claim 12, wherein said substrate is a glass plate.

15. The polarized electroluminescence element according to claim 12, wherein said orientation-inducing layer is a conductive layer.

16. The polarized electroluminescence element according to claim 15, wherein said orientation-inducing layer is made of polyimide.

17. The polarized electroluminescence element according to claim 12, wherein said second direction of orientation is parallel to said first direction of orientation of said orientation-inducing layer.

18. The polarized electroluminescence element according to claim 12, wherein said oriented material of said light-emitting layer is guided by said orientation-inducing layer to align in said second direction of orientation and perform electron-hole transport in a direction perpendicular to said light-emitting layer.

19. The polarized electroluminescence element according to claim 18, wherein said oriented material of said light-emitting layer is discotic liquid crystal molecules.

20. The polarized electroluminescence element according to claim 10, wherein said electroluminescent material of said light-emitting layer is guided by said oriented material to display in said second direction of orientation.

* * * * *